(12) United States Patent  
Kido

(10) Patent No.: US 8,681,210 B2  
(45) Date of Patent: Mar. 25, 2014

(54) COMPONENT MOUNTING DEVICE AND COMPONENT MOUNTING METHOD

(75) Inventor: Kazuo Kido, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/809,656

(22) PCT Filed: Aug. 22, 2011

(86) PCT No.: PCT/JP2011/004644  
§ 371 (c)(1),  
(2), (4) Date: Jan. 11, 2013

(87) PCT Pub. No.: WO2012/026101  
PCT Pub. Date: Mar. 1, 2012

(65) Prior Publication Data  
US 2013/0107033 A1    May 2, 2013

(30) Foreign Application Priority Data  
Aug. 27, 2010    (JP) .................................. 2010 191079

(51) Int. Cl.  
H04N 7/18    (2006.01)  
H05K 13/04    (2006.01)

(52) U.S. Cl.  
USPC .......................................................... 348/86

(58) Field of Classification Search  
USPC .......................................................... 348/86  
See application file for complete search history.

(56) References Cited

U.S. PATENT DOCUMENTS

| | | | |
|---|---|---|---|
| 4,794,689 A * | 1/1989 | Seno et al. ....................... | 29/740 |
| 5,172,468 A | 12/1992 | Tanaka et al. | |
| 6,661,931 B1 * | 12/2003 | Kawada ........................ | 382/276 |
| 2005/0072831 A1 * | 4/2005 | Haji .............................. | 228/102 |
| 2005/0235489 A1 * | 10/2005 | Okuda et al. .................... | 29/832 |

FOREIGN PATENT DOCUMENTS

| | | |
|---|---|---|
| JP | 11-74700 | 3/1999 |
| JP | 2969863 | 8/1999 |
| JP | 2003-333406 | 11/2003 |
| JP | 2008-98411 | 4/2008 |
| JP | 4353736 | 8/2009 |

OTHER PUBLICATIONS

International Search Report issued Oct. 11, 2011 in International (PCT) Application No. PCT/JP2011/004644.  
English translation of International Preliminary Report on Patentability mailed Feb. 28, 2013 in International (PCT) Application No. PCT/JP2011/004644.

* cited by examiner

*Primary Examiner* — Anner Holder  
(74) *Attorney, Agent, or Firm* — Wenderoth, Lind & Ponack, L.L.P.

(57) ABSTRACT

A mounting head is provided with suction nozzles, image capturing cameras, and a movable mirror unit. When the mirror unit is placed at an advance position, mirrors advance into a viewing field of the image capturing cameras and refract an optical axis for image capturing, so that the image capturing cameras can capture images of tips of the suction nozzles and/or held components. When the mirror unit is placed at a retreat position, the mirrors retreat from the viewing field of the image capturing cameras, so that the image capturing cameras can capture images of component supplying positions and mounting positions.

6 Claims, 11 Drawing Sheets

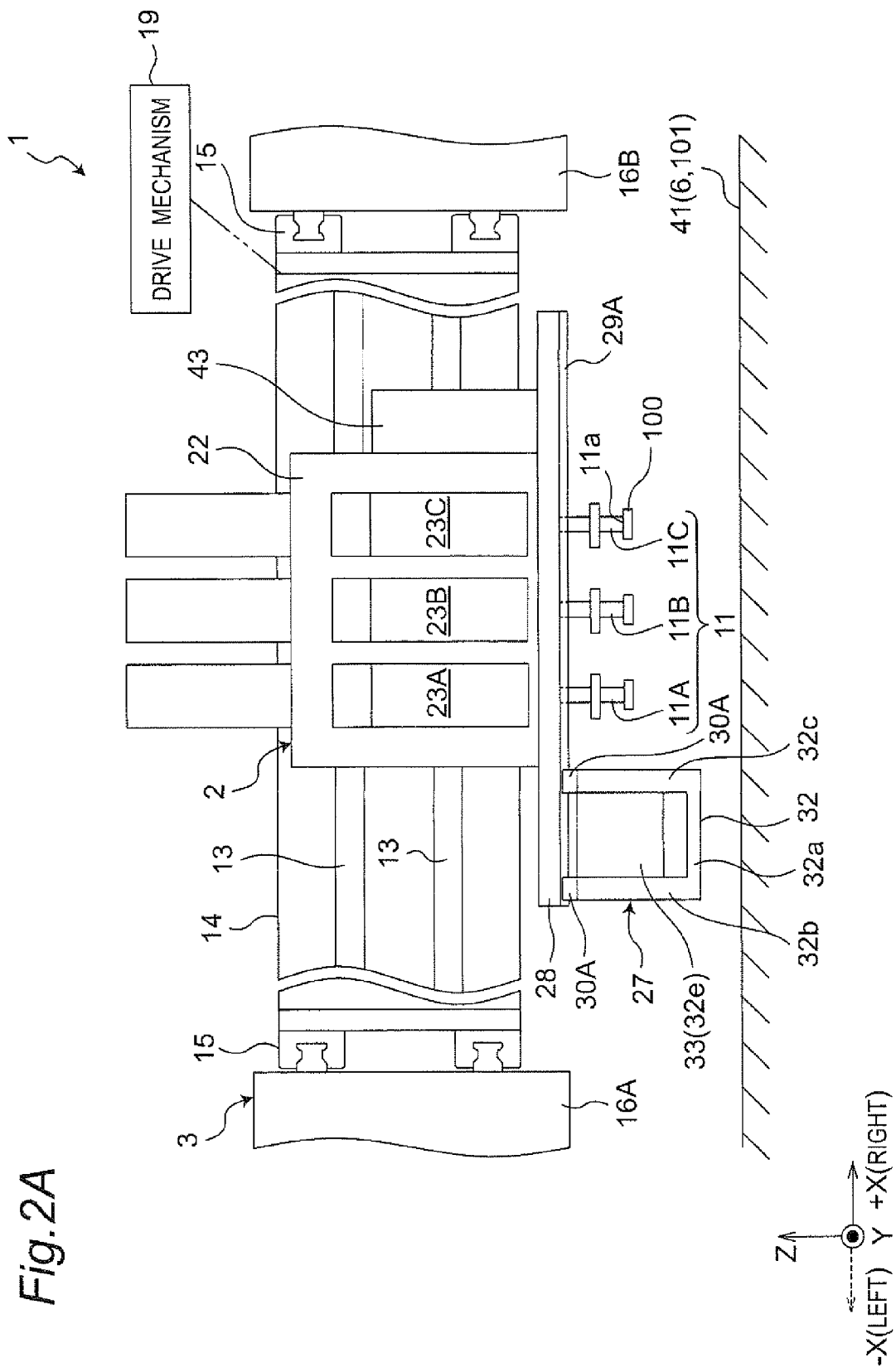

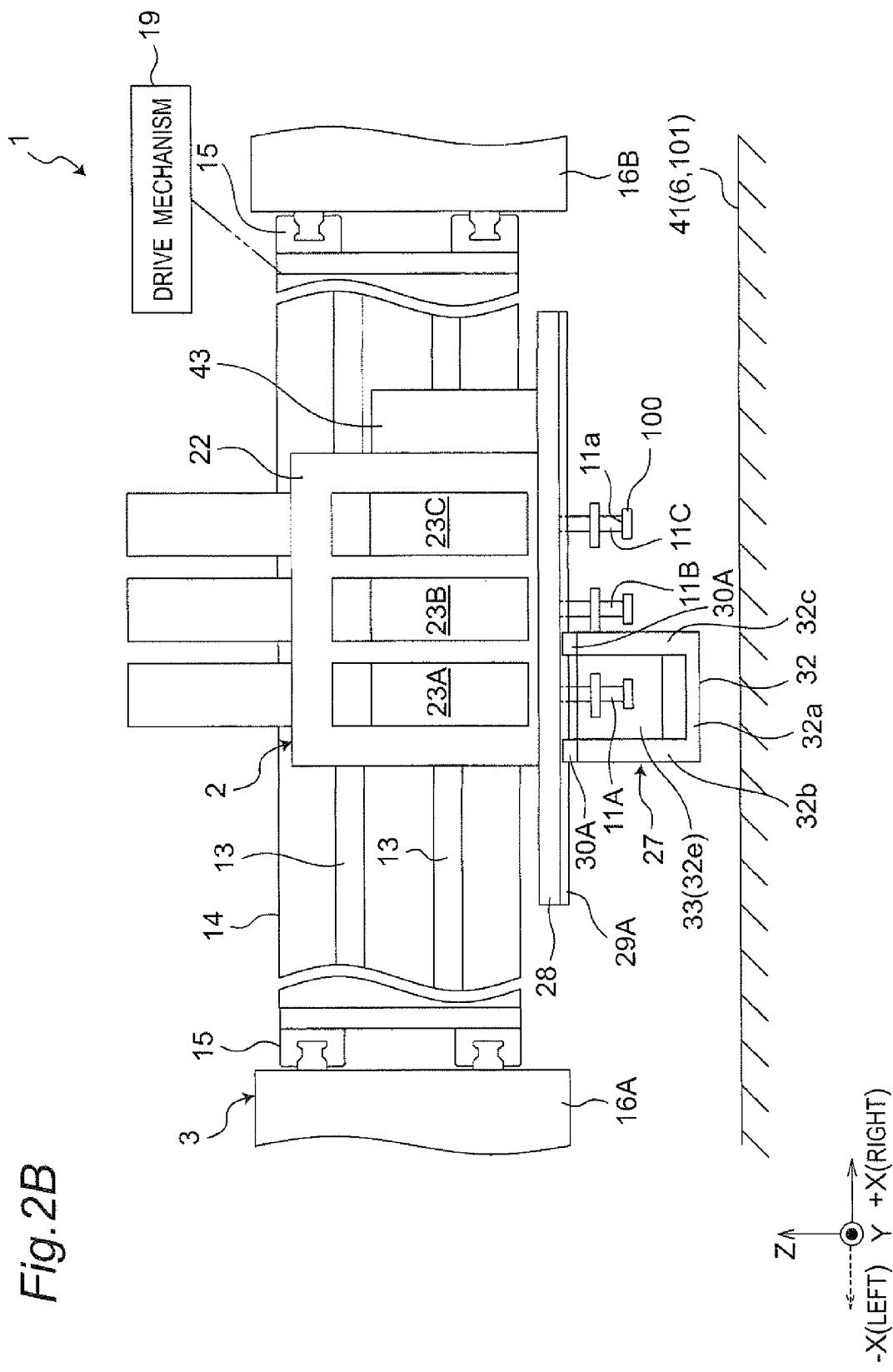

COMPONENT MOUNTING DEVICE AND COMPONENT MOUNTING METHOD

TECHNICAL FIELD

The present invention relates to a component mounting device for mounting a component onto a substrate and a method thereof.

BACKGROUND ART

JP 4353736 B1 discloses a component mounting device in which by changing positions of a prism and a mirror, the same camera is capable of capturing images of a component held by a suction nozzle which is provided in a mounting head from two directions including a lower surface and a side surface. JP 2008-98411 A discloses that a camera installed in a mounting head takes images of a component supplying position where a component before being suctioned and held by a suction nozzle is supplied (for example, a component ejection position of a cassette feeder) and a position on a substrate where the component held by the suction nozzle is mounted (a mounting position).

In order to improve mounting quality by improving precision in success/failure determination of a mounting state and precision in cause analysis of a mounting failure, preferably, images of both a component held by a suction nozzle and another object such as a component supplying position and a mounting position are captured. However, including the devices disclosed in Patent Documents 1, 2, a conventionally known component mounting device is provided with separate cameras for these two objects, and a structure is complicated.

An object of the present invention is to provide a component mounting device capable of capturing images of both a tip of a suction nozzle and/or a component held by the suction nozzle and a component supplying position and/or a mounting position by a common image capturing device and realizing improvement of mounting quality by improving precision in success/failure determination of a mounting state and precision in cause analysis of a mounting failure even with a simple configuration, and a method thereof.

SUMMARY OF THE INVENTION

A first aspect of the present invention provides a component mounting device, including a mounting head provided with a suction nozzle for suctioning and holding a component at a tip thereof, the mounting head holding the component arranged at a component supplying position by the suction nozzle and mounting the component onto a mounting position on a substrate by up-and-down motion, an image capturing device provided in the mounting head, the image capturing device having an optical axis for image capturing which extends straightly and obliquely downward so as to directly capture an image of a captured position below the suction nozzle, and a mirror unit provided with a plurality of reflection surfaces and moved to an advance position where the plurality of reflection surfaces relatively advance into a viewing field of the image capturing device and refract on the optical axis for image capturing of the image capturing device and thereby the image capturing device is capable of taking an image of at least any one of the tip of the suction nozzle and the component held by the suction nozzle, and to a retreat position where the plurality of reflection surfaces retreat from the viewing field of the image capturing device and thereby the optical axis for image capturing extends obliquely downward without going through the reflection surfaces so that the image capturing device is capable of directly capturing an image of at least any one of the component supplying position and the mounting position, the mirror unit being provided in the mounting head.

Since the mirror unit is moved to the advance position and the retreat position, the images of both the tip of the suction nozzle and/or the component held by the suction nozzle and the component supplying position and/or the mounting position can be captured by the common image capturing device. That is, there is no need for providing separate image capturing devices for these image capturing objects, so that a configuration of the component mounting device can be simplified. Since the images of both the tip of the suction nozzle and/or the component held by the suction nozzle and the component supplying position and/or the mounting position are captured, precision in success/failure determination of a mounting state and precision in cause analysis of a mounting failure can be improved.

Specifically, the plurality of suction nozzles are arranged in line along one direction in the mounting head, and the mirror unit is moved along the line direction of the suction nozzles so as to be moved to the advance position and the retreat position.

In this case, preferably, the reflection surfaces have size and a shape to be placed at the advance position for one of the plurality of suction nozzles, and the mirror unit is moved along the line direction of the suction nozzles so as to be placed at the advance position successively for each of the plurality of suction nozzles. With this configuration, the mirror unit can be downsized and weight thereof can be reduced.

Alternatively, the plurality of suction nozzles are arranged in line along one direction in the mounting head, and the mirror unit is moved in the direction crossing the line direction of the suction nozzles so as to be moved to the advance position and the retreat position.

Preferably, the mounting head is supported by an X beam movably in the X direction, the line direction of the suction nozzles is oriented in the X direction, the reflection surfaces have size and a shape to be placed at the advance positions for all the plurality of suction nozzles at the same time, and the mirror unit is placed on the lower side of the X beam at the retreat position. With this configuration, size in the X direction of the mounting head can be reduced.

A second aspect of the present invention provides a component mounting method for suctioning and holding a component arranged at a component supplying position by a tip of a suction nozzle provided in a mounting head and mounting the component onto a mounting position on a substrate, comprising: providing the mounting head with an image capturing device and a mirror unit, the image capturing device having an optical axis for image capturing which extends straightly and obliquely downward so as to directly capture an image of a captured position below the suction nozzle, the mirror unit being provided with a plurality of reflection surfaces and movable to an advance position where the plurality of reflection surfaces relatively advance into a viewing field of the image capturing device and refract an optical axis for image capturing of the image capturing device and refract, and to a retreat position where the plurality of reflection surfaces retreat from the viewing field of the image capturing device, moving the mirror unit to the advance position so that the image capturing device captures an image of at least one of the component held by the suction nozzle when the mounting head goes toward the mounting position after holding the component at the component supplying and the tip of the suction nozzle when the mounting head returns to the component supplying position after mounting the component onto the mounting position, and moving the mirror unit to the retreat position so that the optical axis of the image capturing extends straightly and obliquely downward without going through the reflection mirrors, and thereby the image capturing device directly capture an image of at least any one of the component at the component supplying position, the mounting position of the substrate before mounting the component, and the mounting position of the substrate after mounting the component positioned at the image captured position.

According to the component mounting device of the present invention and the method thereof, since the mirror unit is moved to the advance position and the retreat position, the images of both the tip of the suction nozzle and/or the component held by the suction nozzle and the component supplying position and/or the mounting position can be captured by the common image capturing device. Thus, even with a simple configuration, improvement of mounting quality can be realized by improving precision in success/failure determination of a mounting state or the like.

BRIEF DESCRIPTION OF THE DRAWINGS

FIG. 2A is a view in which a mounting head in the first embodiment is seen from the Y direction (a mirror unit is placed at a retreat position);

FIG. 2B is a view in which the mounting head in the first embodiment is seen from the Y direction (the mirror unit is placed at an advance position for a suction nozzle on a left end);

DETAILED DESCRIPTION OF THE INVENTION

Next, embodiments of the present invention will be described in detail with reference to the attached drawings.

First Embodiment

Figure 1:
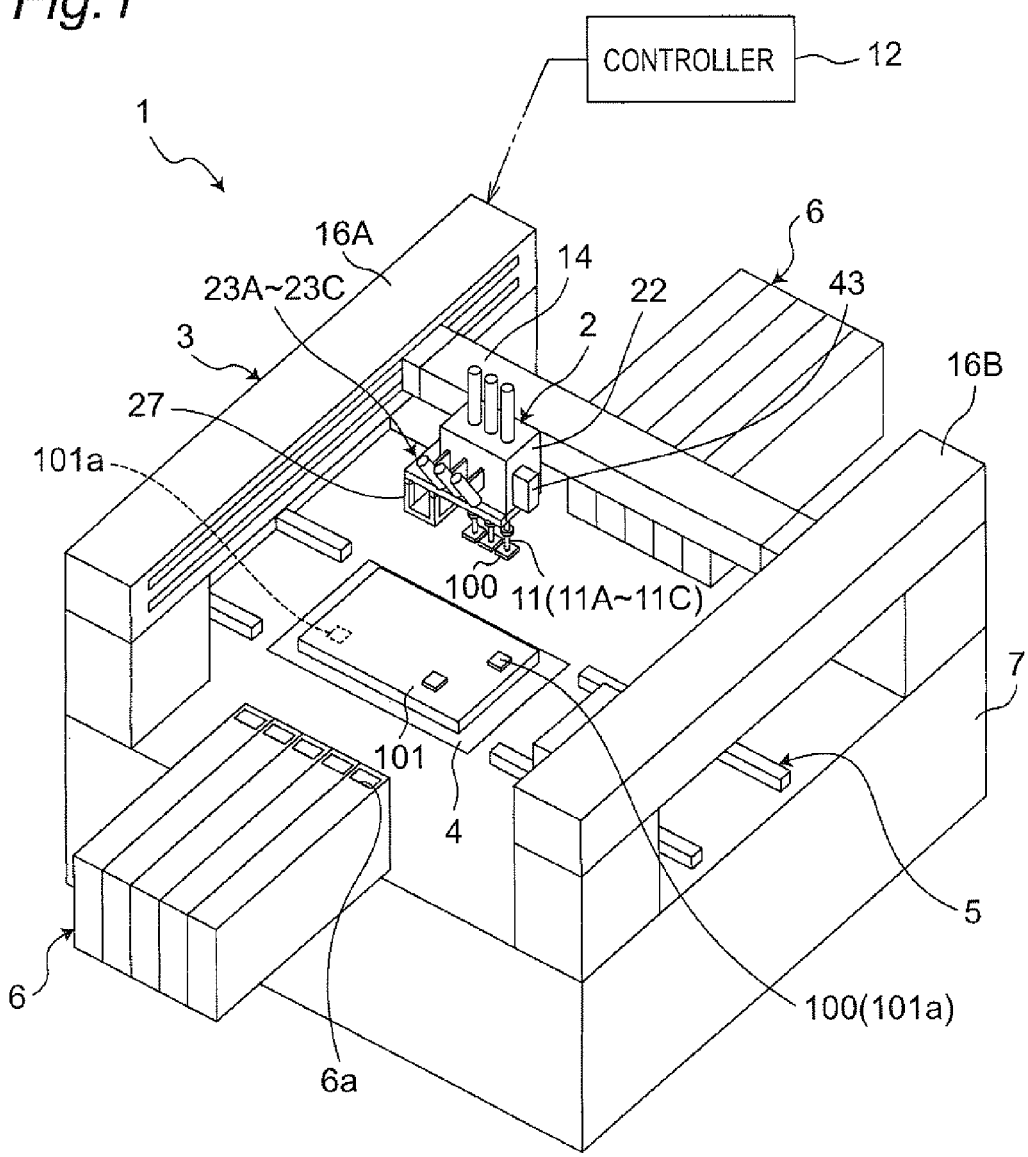
FIG. 1 is a schematic perspective view showing a component mounting device according to a first embodiment of the present invention.

Referring to FIG. 1, a component mounting device 1 is provided with a mounting head 2, a head positioning device 3 for positioning the mounting head 2 in the XY directions, a substrate holding table 4, a substrate carrying unit 5, and a component supplying unit 6 serving as for example a collectivity of a plurality of cassette feeders on a platform 7. The mounting head 2 is provided with a plurality of suction nozzles 11A, 11B, 11C for suctioning and holding components 100. Each of the suction nozzles 11A to 11C is movable upward and downward in the Z direction, and rotatable about an axis of the Z direction. Both the X direction and the Y direction are the directions along a surface of a substrate 101 (within a substantially horizontal surface in the present embodiment) and orthogonal to each other. The Z direction is the direction orthogonal to the X direction and the Y direction (the substantially vertical direction in the present embodiment). It should be noted that in FIG. 1, a near-side mounting head and a positioning device thereof are not shown in the figure.

The substrate 101 carried in by the substrate carrying unit 5 is held by the substrate holding table 4. By being moved in the XY directions by the head positioning device 3, the mounting head 2 is positioned to component supplying positions 6a of the component supplying unit 6 (for example, component ejection positions of the cassette feeders or recess parts serving as component ejection objects of a component supplying tray). Each of the suction nozzles 11A to 11C goes downward so as to suction and hold the component 100. After that, by moving the mounting head 2 in the XY directions by the head positioning device 3, the suction nozzles 11A to 11C are positioned to mounting positions 101a on the substrate 101, so that the suctioned and held components 100 are mounted. Until mounting of all the components 100 is completed, suctioning and holding of the components 100 in the component supplying unit 6 by the suction nozzles 11A to 11C and subsequent mounting of the components 100 onto the substrate 101 are repeated. The substrate 101 after completion of mounting is carried out from the substrate holding table 4 by the substrate carrying unit 5. Actions of the component mounting device 1 including the mounting head 2, the head positioning device 3, the substrate carrying unit 5, and a mirror drive mechanism 36 described later are controlled by a controller 12 schematically shown only in FIG. 1.

Further referring to FIGS. 2A to 3A, the head positioning device 3 is provided with an X beam 14 extending in the X direction and supporting the mounting head 2 movably in the X direction by X-direction direct movement guides 13, and a pair of Y beams 16A, 16B extending in the Y direction and supporting both ends of the X beam 14 movably in the Y direction by Y-direction direct movement guides 15. Both ends of each of the Y beams 16A, 16B are fixed to the platform 7. The mounting head 2 is moved on the X-direction direct movement guides 13 by a X-direction drive mechanism 18 serving as a linear motor for example, and the X beam 14 is moved on the Y-direction direct movement guides 15A, 15B by the Y-direction drive mechanism 19 similarly serving as a linear motor for example.

Hereinafter, mainly referring to FIGS. 2C and 3B, the mounting head 2 will be described in detail. The mounting head 2 is provided with a head main body 22 fixed to a carriage plate 21 which is installed in the X beam 14 via the above X-direction direct movement guides 13.

The plurality of (three in the present embodiment) suction nozzles 11A, 11B, 11C are provided in the head main body 22. These suction nozzles 11A to 11C extend substantially downward in the vertical direction from the head main body 22, and tip surfaces 11a on which suction holes are formed (refer to FIG. 2A) are downward. In the present embodiment, the suction nozzles 11A to 11C are placed in line along one direction so as to make a straight line in a plan view. The line direction thereof is set to be the X direction (the direction in which the mounting head 2 is moved on the X beam 14). In the head main body 22, a mechanism for moving the suction nozzles 11A to 11C upward and downward in the Z direction and a mechanism for rotating the suction nozzles about axes thereof are built. In the head main body 22, a vacuum valve placed between each of the suction nozzles 11A to 11C and a vacuum source is built. When the vacuum valve is opened, each of the suction nozzles 11A to 11C communicates with the vacuum source so as to suction and hold the component 100 by the tip surface 11a. When the vacuum valve is closed, communication with the vacuum source is blocked and suctioning and holding of the component 100 are cancelled.

For each of the suction nozzles 11A to 11C, an image capturing camera (image capturing device) 23A, 23B, 23C provided with an imaging element such as a CCD imaging element is provided. In the present embodiment, each of the image capturing cameras 23A to 23C is fixed to the head main body 22 via a camera bracket 24. As most clearly shown in FIGS. 3A and 3B, each of the image capturing cameras 23A to 23C is arranged adjacently to the side of the corresponding suction nozzle 11A, 11B or 11C. In the present embodiment, the viewing direction of the image capturing cameras 23A to 23C is fixed to be obliquely downward. For each of the image capturing cameras 23A to 23C, an illumination device 25 provided with light emitting elements such as a plurality of LEDs is provided.

A mirror unit 27 moved in the X direction is provided in the mounting head 2. In the vicinity of a lower end of the head main body 22, a plate shape rail bracket 28 protruding in the X direction (refer to FIGS. 2A to 2C) and protruding in the Y direction (refer to FIGS. 3A, 3B) is provided. A guide rail 29A extending in the X direction is provided on a lower surface of a tip part in the Y direction of this rail bracket 28, and another guide rail 29B is provided on a lower surface of the rail bracket 28 and the head main body 22 so as to be parallel to this guide rail 29A. Guide blocks 30A, 30B are respectively engaged with these guide rails 29A, 29B so as to go back and forth in the X direction. A hollow casing 32 of the mirror unit 27 is suspended on these guide blocks 30A, 30B.

The casing 32 of the mirror unit 27 is provided with a plate shape base portion 32a spreading on a substantial XY plane, and a pair of support rods 32b, 32c protruding upward from the tip side of the Y direction of this base portion 32a (the left end side in FIGS. 3A and 3B), the support rods being arranged so as to have a gap in the X direction. The casing 32 is also provided with a support wall 32d protruding upward from the rear end side of the Y direction of the base portion 32a (the right end side in FIGS. 3A and 3B). The guide block 30A is respectively fixed to upper ends of the support rods 32b, 32c, and the guide block 30B is fixed to an upper end of the support wall 32d. When the mirror unit 27 is relatively moved to advance positions described later, a front surface opening 33 surrounded by the base portion 32a and the support rods 32b, 32c allow an optical axis for image capturing of the image capturing cameras 23A to 23C toward an image capturing object to pass through to an internal space 32e of the casing 32. Side surface openings 34A, 34B surrounded by the support wall 32d and the support rods 32b, 32c allow the suction nozzles 11A to 11C to advance into and retreat from the internal space 32e in accordance with movement of the mirror unit 27. That is, by these side surface openings 34A, 34B, the casing 32 of the mirror unit 27 is movable in the X direction without contacting with the suction nozzles 11A to 11C.

The mirror unit 27 is moved to go back and forth in the X direction along the guide rails 29A, 29B by the mirror drive mechanism 36 formed by for example a linear motor, a motor ball screw mechanism, or the like. Specifically, the mirror unit 27 is movable in the +X direction from a retreat position where the mirror unit is placed on the further left side of the leftmost suction nozzle 11A among the three suction nozzles 11A to 11C (−X side) as shown in FIG. 2A and any of the suction nozzles 11A to 11C is not arranged in the internal space 32e of the mirror unit 27, in other words, not arranged with respect to the suction nozzle 11A, 11B or 11C serving as the image capturing object, through a position where the leftmost suction nozzle 11A advances into the internal space 32e of the mirror unit 27 as shown in FIG. 2B and a position where the center suction nozzle 11B is placed in the internal space 32e (not shown), to an advance position where the rightmost suction nozzle 11C is placed in the internal space 32e of the mirror unit 27 as shown in FIG. 2C. Conversely, the mirror unit 27 is movable in the −X direction from the position where the rightmost suction nozzle 11C advances into the internal space 32e of the mirror unit 27 shown in FIG. 2C to for example the retreat position shown in FIG. 2A.

A reflective optical system 37 is accommodated in the internal space 32e of the casing 32 of the mirror unit 27. The reflective optical system 37 in the present embodiment is provided with two mirrors 38A, 38B fixed to the base portion 32a of the casing 32, both the mirrors serving as flat mirrors. Both reflection surfaces of the mirrors 38A, 38B are upward.

Figure 2C:
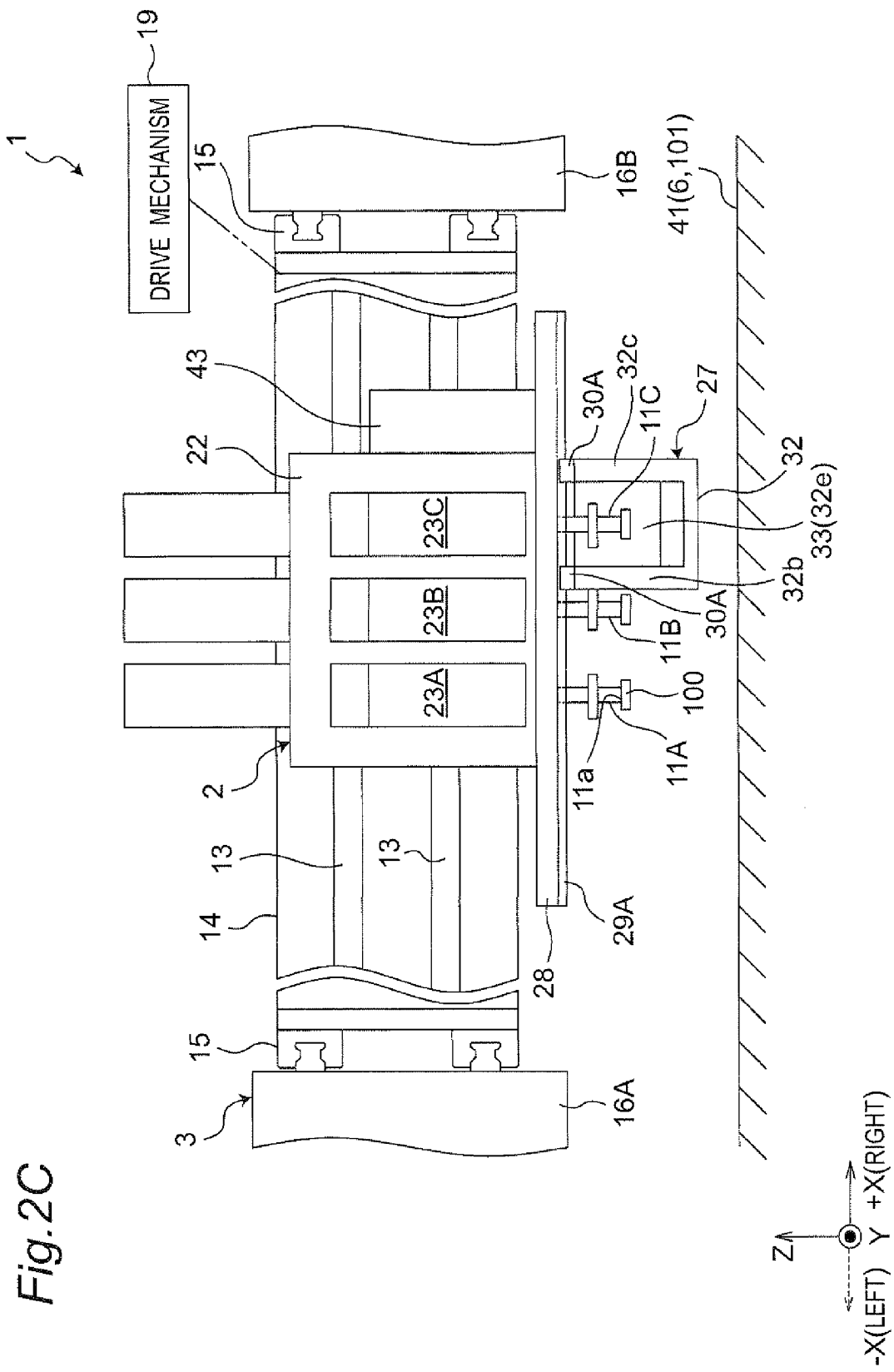
FIG. 2C is a view in which the mounting head in the first embodiment is seen from the Y direction (the mirror unit is placed at an advance position for a suction nozzle on a right end)
Figure 3A:
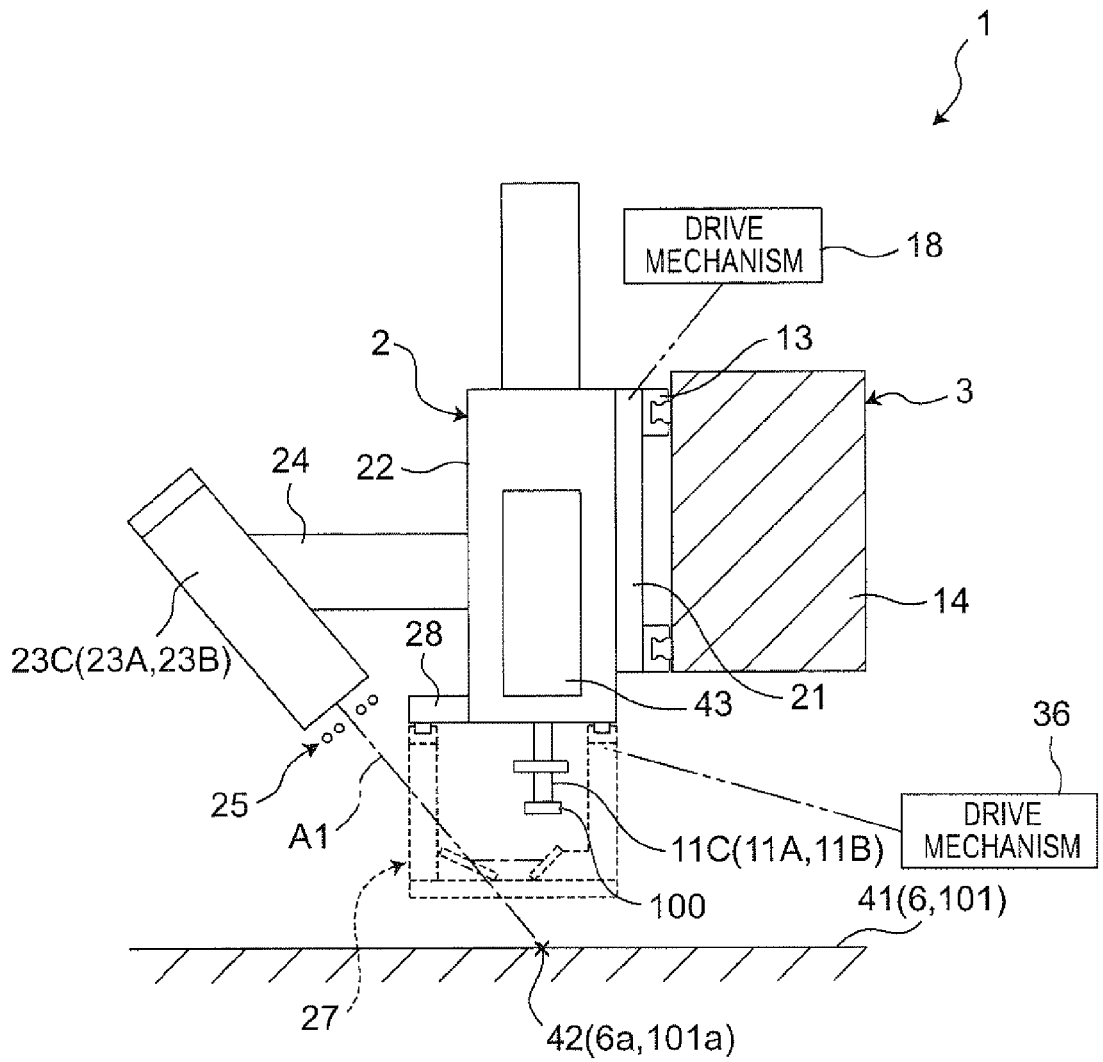
FIG. 3A is a view in which the mounting head in the first embodiment is seen from the X direction (the mirror unit is placed at the retreat position (refer to FIG. 2A))

As shown in FIGS. 2A and 3A, when the mirror unit 27 is placed at the retreat position, the reflection surfaces of the mirrors 38A, 38B relatively retreat from a viewing field of the image capturing cameras 23A to 23C (are not placed in the viewing field of the image capturing cameras 23A to 23C). Therefore, as shown by one-chain line A1 in FIG. 3A, the optical axis for image capturing of the image capturing cameras 23A to 23C extends directly obliquely downward without bending. A focal point distance of the image capturing cameras 23A to 23C is set so that an image capturing position 42 serving as a position where an axis of the suction nozzle 11A, 11B or 11C crosses on an image capturing object 41 arranged on the lower side of the suction nozzle 11A, 11B or 11C when the mirror unit 27 is placed at the retreat position is in focus in a depth of focus. As described later, the image capturing object 41 is the component supplying unit 6 or the substrate 101 on the substrate holding table 4. The image capturing position 42 in a case of the former is the component supplying positions 6a, and the image capturing position 42 in a case of the latter is the mounting positions 101a. It should be noted that although the retreat position of the mirror unit 27 is described as a position where the suction nozzle 11A, 11B or 11C is not arranged in the internal space 32e of the mirror unit 27, the retreat position of the mirror unit 27 also includes a case where the mirror unit is placed in a region so as not to be arranged for the suction nozzle 11A, 11B or 11C of the image capturing object.

Figure 3B:
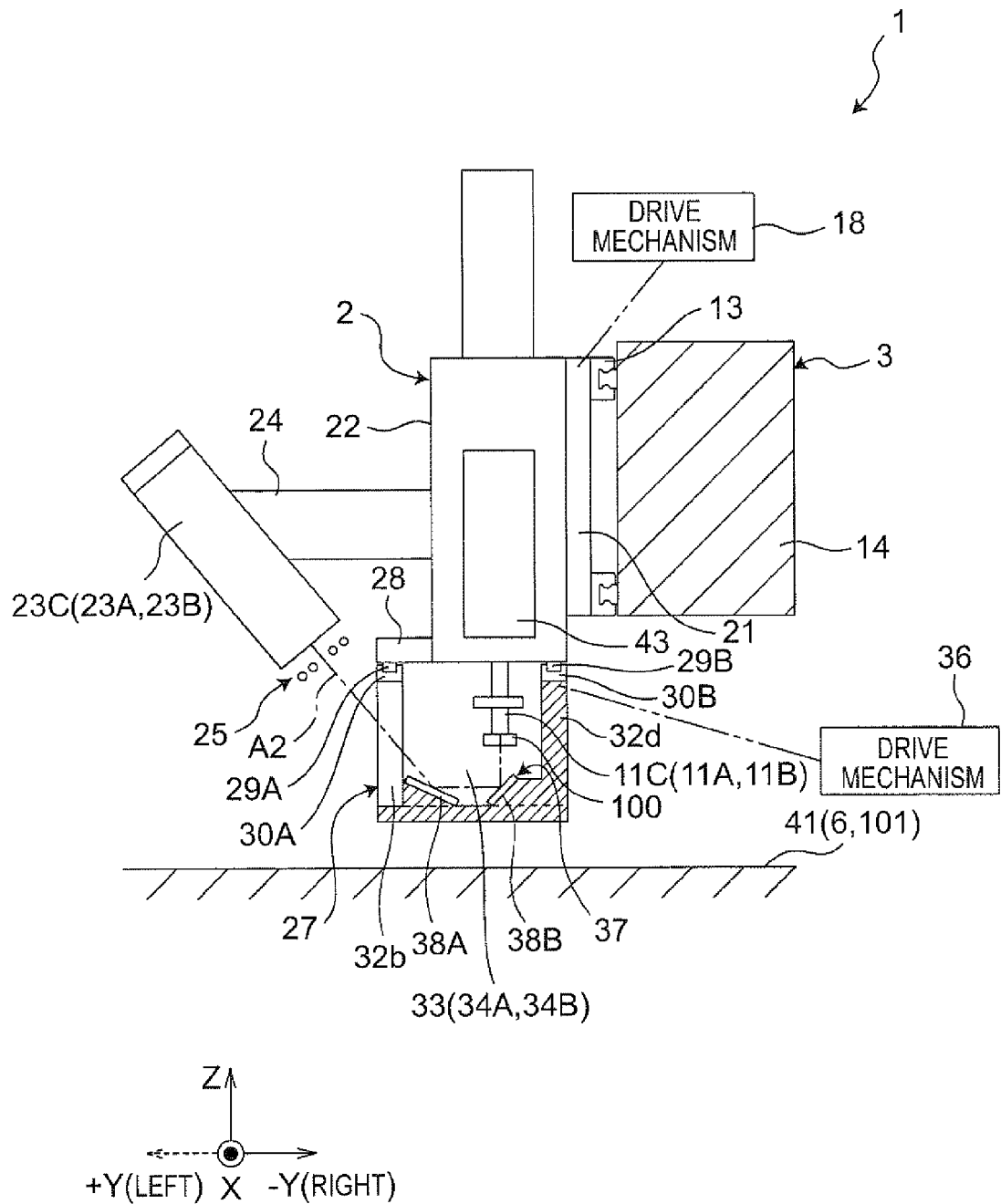
FIG. 3B is a view in which the mounting head in the first embodiment is seen from the X direction (the mirror unit is placed at the advance position for the suction nozzle on the right end (refer to FIG. 2C))

Referring to FIGS. 2B, 2C, and 3B, when the mirror unit 27 is placed at any of the advance positions of the suction nozzles 11A to 11C, the reflection surfaces of the mirrors 38A, 38B of the mirror unit 27 relatively advance into the viewing field of the corresponding image capturing camera 23A, 23B or 23C. Therefore, as shown by one-chain line A2 in FIG. 3B, the optical axis for image capturing of the image capturing camera 23A, 23B or 23C is bent and directed to the tip surface 11a of the suction nozzle 11 (11A to 11C). Tracking the optical axis A2 of image capturing from the side of the image capturing cameras 23A to 23C, firstly, the obliquely downward optical axis A2 is reflected by the reflection surface of the mirror 38A and turned to be in the substantially horizontal direction (the −Y direction) so as to advance into the reflection surface of the mirror 38B. By being reflected at the position where the axis of the suction nozzle 11 (11A to 11C) crosses on the reflection surface of the mirror 38, the optical axis A2 of image capturing in the substantially horizontal direction is turned to be upward in the vertical direction (the +Z direction) so as to go toward the tip surface 11a of the suction nozzle 11 (11A to 11C). Positions and postures of the mirrors 38A, 38B are set so that when the mirror unit 27 is placed at the advance position, the tip surface 11a of the suction nozzle 11 (11A to 11C) (the component 100 when the component 100 is suctioned and held by the tip surface 11a) is in focus of the image capturing camera 23A, 23B or 23C in the depth of focus.

Size and a shape of the reflection surfaces of the mirrors 38A, 38B in the present embodiment are set so that the mirror unit is placed at the advance position for only one of the suction nozzles 11A to 11C. That is, when the mirror unit 27 is placed at the advance position for any of the suction nozzles 11A to 11C, the reflection surfaces of the mirrors 38A, 38B relatively advance into the viewing field of the image capturing camera 23A, 23B or 23C corresponding to the suction nozzle 11A, 11B or 11C and bend the optical axis for image capturing but do not advance into the viewing field of the image capturing cameras 23A to 23C corresponding to the other suction nozzles 11A to 11C. For example, when the mirror unit 27 is placed at the advance position for the suction nozzle 11A, the reflection surfaces of the mirrors 38A, 38B advance into the viewing field of the image capturing camera 23A and bend the optical axis for image capturing but does not advance into the viewing field of the remaining image capturing cameras 23B, 23C.

The head main body 22 of the mounting head 2 is provided with an image capturing camera 43 having a downward viewing field for capturing an image of a substrate mark provided in the substrate 101. The image capturing camera 43 is fixed at a position where the viewing field is not disturbed even when the mirror unit 27 is placed at any of the retreat position and the advance positions.

Next, focusing on image capturing by the image capturing cameras 23A to 23C, the actions of the component mounting device will be described.

By moving the substrate 101 carried in by the substrate carrying unit 5 in the XY directions by the head positioning device 3 after holding by the substrate holding table 4, the mounting head 2 is moved to the upper side of the substrate 101. The image capturing camera 43 of the mounting head 2 captures an image of the substrate mark of the substrate 101, and based on the obtained image, the control unit 12 recognizes a position and a posture of the substrate 101.

Next, the mounting head 2 is moved to the upper side of the component supplying unit 6. Then, the suction nozzles 11A to 11C are successively positioned to any of the component supplying positions 6a. At a time point when the suction nozzles 11A to 11C are positioned to the component supplying positions 6a, the image capturing cameras 23A to 23C capture images of the components 100 placed at the component supplying positions 6a (the components 100 to be suctioned and held by the suction nozzles 11A to 11C). Specifically, as shown in FIGS. 2A and 3A, the mirror unit 27 is moved to the retreat position, the optical axis A1 for image capturing of the image capturing cameras 23A to 23C becomes an obliquely downward straight line without bending, and the images of the components 100 placed at the component supplying positions 6a are captured in this state. The control unit 12 recognizes positions and postures of the components 100 based on the obtained images, and further, based on recognition results and according to need, executes correction of positions and the like of the suction nozzles 11A to 11C with respect to the components 100 by the head positioning device 3. After that, the suction nozzles 11A to 11C go downward in the Z direction until the tip surfaces 11a are abutted with the components 100 placed at the component supplying positions 6a, and go upward in the Z direction after suctioning and holding are started.

After all the suction nozzles 11A to 11C suction and hold the components 100, or at every time when the component 100 is suctioned by the suction nozzle 11 (11A to 11C), the image capturing camera 23 (23A to 23C) captures the image of the component 100 suctioned and held by the suction nozzle 11 (11A to 11C). Specifically, while being moved rightward (in the +X direction) in the figure from the retreat position shown in FIG. 2A, the mirror unit 27 driven by the mirror drive mechanism 36 is placed at the advance position successively for each one of the suction nozzles 11A to 11C, so that the images of the components 100 suctioned and held by the suction nozzles 11A to 11C for which the mirror unit is placed the advance positions are captured from a lower surface. For example, as shown in FIGS. 2C and 3B, when the mirror unit 27 is placed at the advance position for the suction nozzle 11C, the mirrors 38A, 38B of the reflective optical system 37 advance into the viewing field of the image capturing camera 23C, so that the optical axis A2 for image capturing is bent and directed to the lower surface of the component 100 suctioned and held by the tip surface 11a of the suction nozzle 11C. The control unit 12 recognizes the postures and the like of the components 100 suctioned and held by the suction nozzles 11A to 11C based on the obtained images, and corrects the postures of the components 100 by rotating the suction nozzles 11A to 11C about the axes thereof (about the Z axes) according to need. In a case where the recognized postures and the like of the components 100 cannot be corrected, the control unit 12 moves the components to a component disposal unit (not shown) and disposes the components 100.

Next, the mounting head 2 is moved to the upper side of the substrate 101 held by the substrate holding table 4. Then, the components 100 suctioned and held by the suction nozzles 11A to 11C are positioned to the corresponding mounting positions 101a on the substrate 101, and mounted onto the mounting positions 101a after positioning.

The actions from positioning of the components 100 onto the mounting positions 101a to mounting will specifically be described taking the suction nozzle 11A as an example. Firstly, by moving the mounting head 2 in the XY directions by the head positioning device 3, the component 100 suctioned and held by the suction nozzle 11A is positioned to the corresponding mounting position 101a. After this positioning, the image capturing camera 23A captures an image of the mounting position 101a, more specifically a recognition mark, an electrode, a bump, a solder ball, or the like placed at the mounting position 101a. At the time of capturing the image of this mounting position 101a, the mirror unit 27 is placed at the retreat position (FIGS. 2A and 3A), and the mirrors 38A, 38B of the reflective optical system 37 relatively retreat from the viewing field of the image capturing camera 23A. The control unit 12 recognizes a position and a shape of the recognition mark, the electrode, the bump, the solder ball, or the like based on the obtained image, and further, based on a recognition result and according to need, executes correction of the position and the like of the component 100 suctioned and held by the suction nozzle 11A with respect to the mounting position 101a. Next, the suction nozzle 11A goes downward so as to mount the component onto the mounting position 101a. After mounting the component 100, the image capturing camera 23A captures an image of the mounting position 101a again. The control unit 12 recognizes a posture and the like of the component 100 already mounted onto the mounting position 101a based on the obtained image, and based on a recognition result, executes necessary processing such as success/failure determination of a mounting state and error processing in accordance with a determination result.

After mounting of the components 100 of all the suction nozzles 11A to 11C is completed, the mounting head 2 is moved to the component supplying unit 6 again, and repeats suctioning and holding of the components 100 by the suction nozzles 11A to 11C described above. Before the mounting head 2 is moved to the component supplying unit 6 after completion of mounting, the image capturing cameras 23A to 23C capture images of the suction nozzles 11A to 11C from the side of the tip surfaces 11a. Specifically, while being moved rightward (in the +X direction) or leftward (in the −X direction) in the figure from the retreat position shown in FIG. 2A, the mirror unit 27 driven by the mirror drive mechanism 36 is placed at the advance position successively for the suction nozzles 11A to 11C, so that the images of the suction nozzles 11A to 11C placed at the advance positions are captured. The control unit 12 recognizes solder clogs in the suction nozzles 11A to 11C, existence/non-existence of non-mounted components 100, and the like from the obtained images, and executes necessary error processing in accordance with a recognition result.

Until mounting of the components 100 onto all the mounting positions 101a of the substrate 101 is completed, the above actions are repeated. The substrate 101 in which mounting of all the components 100 is completed is carried out from the substrate holding table 4 by the substrate carrying unit 5.

In the component mounting device 1 of the present embodiment, by moving the mirror unit 27 to the advance positions and the retreat position, the common image capturing cameras 23A to 23C can capture images of the component supplying positions 6a and the mounting positions 101a (before mounting the components 100 and after mounting the components 100) in addition to the tip surfaces of the suction nozzles 11A to 11C and the components 100 held by the suction nozzles 11A to 11C. That is, there is no need for providing separate image capturing cameras for these image capturing objects, so that a configuration of the component mounting device 1 can be simplified. By capturing the images of both the tip surfaces 11a of the suction nozzles 11A to 11C and/or the components 100 held by the suction nozzles and the component supplying positions 6a and/or the mounting positions 101a, precision in the success/failure determination of the mounting state and precision in cause analysis of a mounting failure can be improved. As described above, in the component mounting device 1 of the present embodiment, even with a simple configuration, improvement of mounting quality can be realized by improving the precision in the success/failure determination of the mounting state or the like.

The mirror unit 27 provided in the component mounting device 1 of the present embodiment is placed at the advance position successively for each one of the suction nozzles 11A to 11C, so that the images of the components 100 suctioned and held by the suction nozzles 11A to 11C for which the mirror unit is placed at the advance positions are captured from the lower surface. That is, the size and the shape of the mirrors 38A, 38B forming the reflective optical system 37 are not required to be set so that the mirrors advance into the viewing field of all the image capturing cameras 23A to 23C but may be set so that the mirrors successively advance into the viewing field of each one of these image capturing cameras. As a result, small mirrors may be used as the mirrors 38A, 38B, so that the mirror unit 27 can be downsized and weight thereof can be reduced.

Second Embodiment

Figure 4:
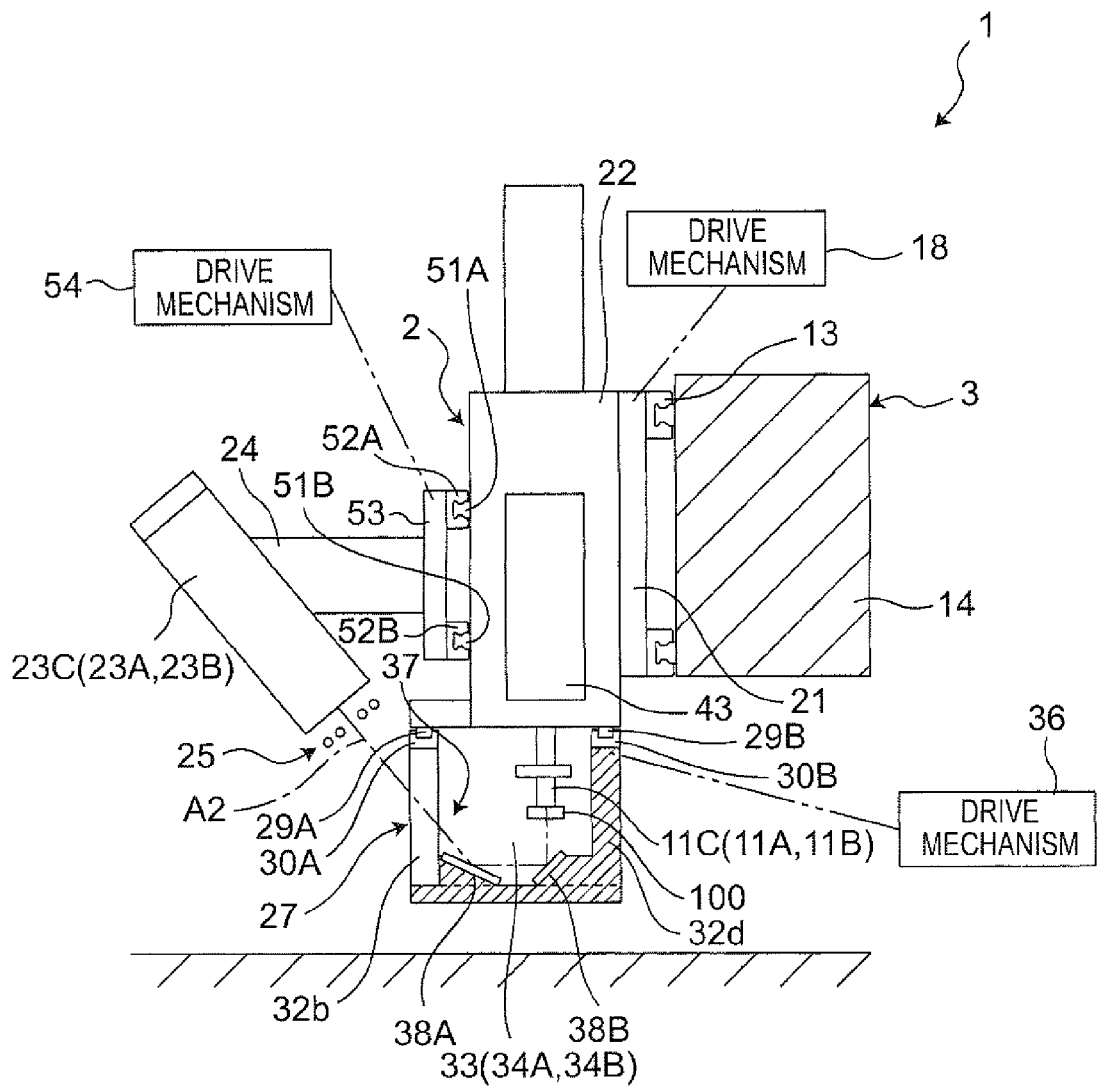
FIG. 4 is a view in which a mounting head of a component mounting device according to a second embodiment of the present invention is seen from the X direction (a mirror unit is placed at an advance position)
Figure 5:
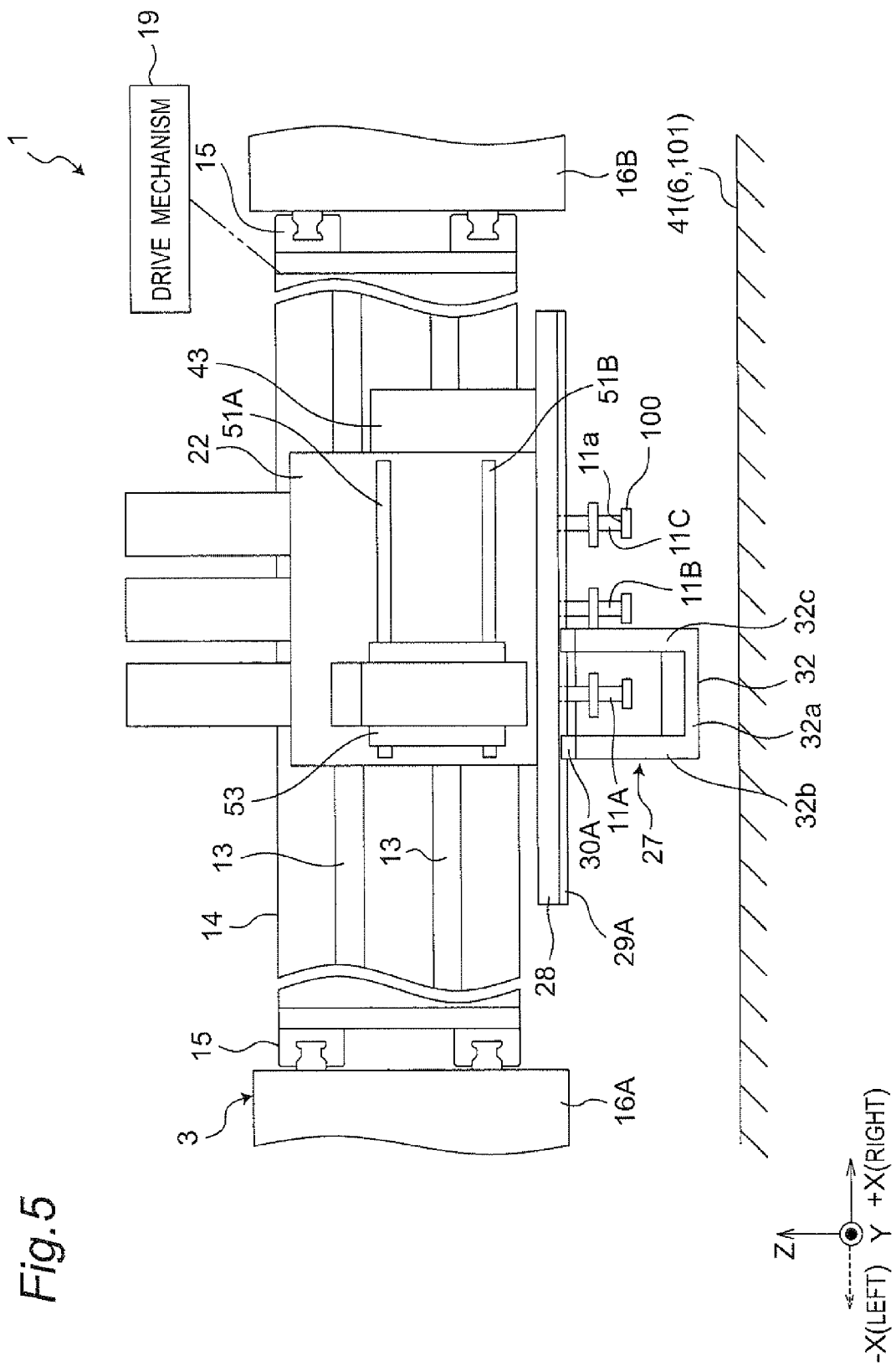
FIG. 5 is a view in which the mounting head in the second embodiment is seen from the Y direction (the mirror unit is placed at an advance position for a suction nozzle on a left end)

FIGS. 4 and 5 show a component mounting device 1 according to a second embodiment of the present invention. A mounting head 2 in the present embodiment is provided with one common movable image capturing camera 23 for all suction nozzles 11A to 11C.

Guide rails 51A, 51B extending in the X direction in parallel to each other are provided in a head main body 22 of the mounting head 2. Guide blocks 52A, 52B are respectively engaged with these guide rails 51A, 51B so as to go back and forth in the X direction. A carriage plate 53 is fixed to these guide blocks 52A, 52B. A base end of a camera bracket 24 provided with the image capturing camera 23 in a tip is fixed to the carriage plate 53. The carriage plate 53 is moved to go back and forth in the X direction along the guide rails 51A, 51B by a drive mechanism 54 serving as a linear motor for example, and thereby, the image capturing camera 23 is moved in the X direction.

The image capturing camera 23 in the present embodiment is moved in the X direction as well as a mirror unit 27. Specifically, the image capturing camera 23 is moved in the X direction in synchronization with the mirror unit 27. At the same time as placement of the mirror unit 27 at the advance position successively for each one of the suction nozzles 11A to 11C, the image capturing camera 23 is also successively moved to each one of the suction nozzles 11A to 11C so as to capture the images of the tip surfaces 11a of the suction nozzles 11A to 11C and the components 100 suctioned by the suction nozzles. Alternatively, by placing the mirror unit 27 at the advance position successively for each one of the suction nozzles 11A to 11C, and following movement of the mirror unit 27, moving the image capturing camera 23 to the suction nozzle 11A to 11C for which the mirror unit 27 is placed at the advance position, image capturing of the tip surfaces 11a of the suction nozzles 11A to 11C and the components 100 suctioned by the suction nozzles may be executed. Alternatively, by moving the image capturing camera 23 successively to each one of the suction nozzles 11A to 11C, and following movement of the image capturing camera 23, placing the mirror unit 27 to the suction nozzle 11A, 11B or 11C at which the image capturing camera 23 is placed, image capturing of the tip surfaces 11a of the suction nozzles 11A to 11C and the components 100 suctioned by the suction nozzles may be executed. In sum, the mirror unit 27 and the image capturing camera 23 may be moved in synchronization or one of the mirror unit and the image capturing camera may be moved earlier than the other. By adopting the movable image capturing camera 23 as in the present embodiment, the number of image capturing cameras can be reduced. Particularly in a case where the number of suction nozzles is large, a structure of the component mounting device 1 can be simplified and cost can be reduced.

Since other configurations and operations of the second embodiment are the same as the first embodiment, the same elements are given the same reference signs and description thereof is omitted.

Third Embodiment

Figure 6A:
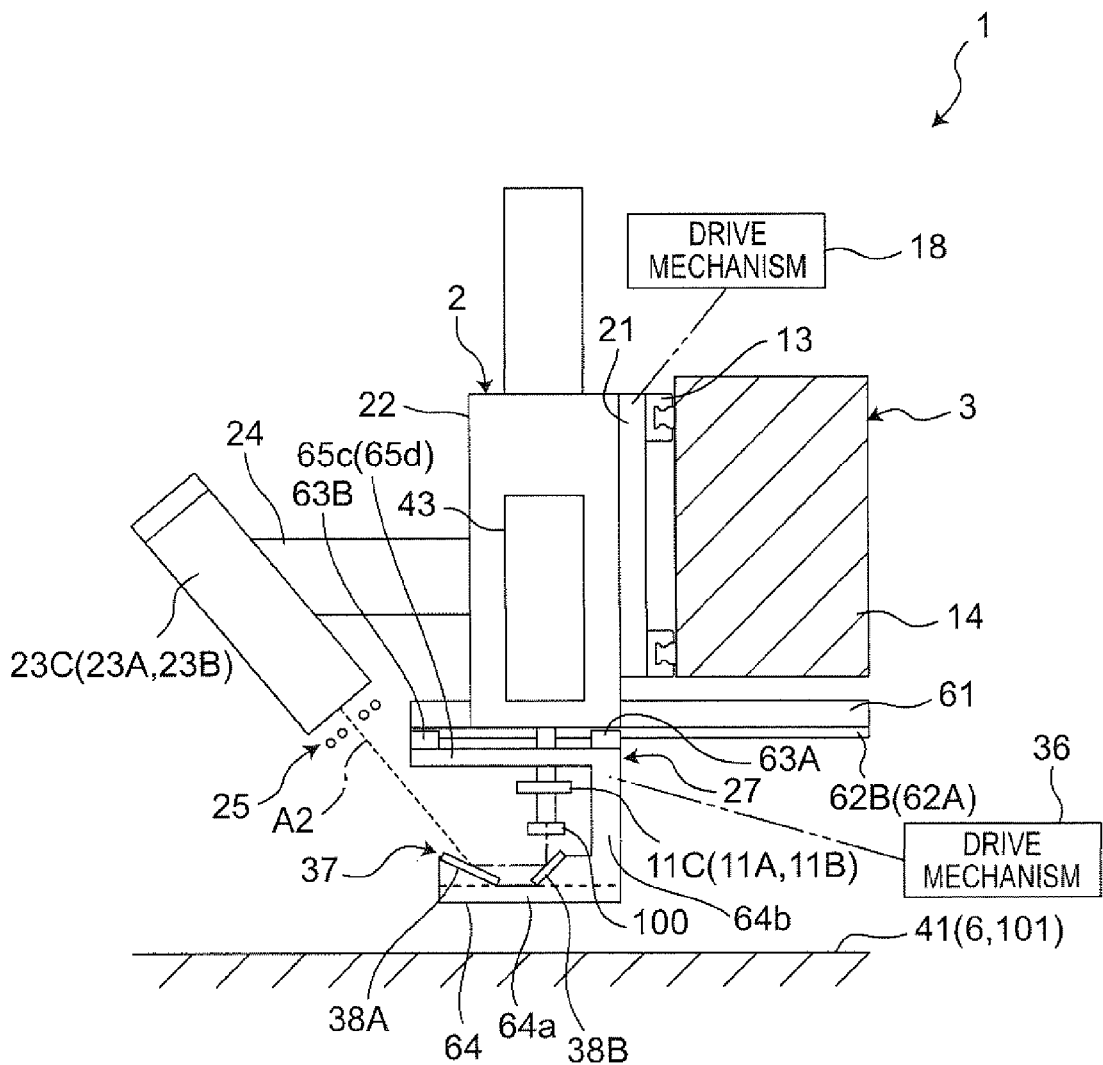
FIG. 6A is a view in which a mounting head of a component mounting device according to a third embodiment of the present invention is seen from the X direction (a mirror unit is placed at an advance position)
Figure 6B:
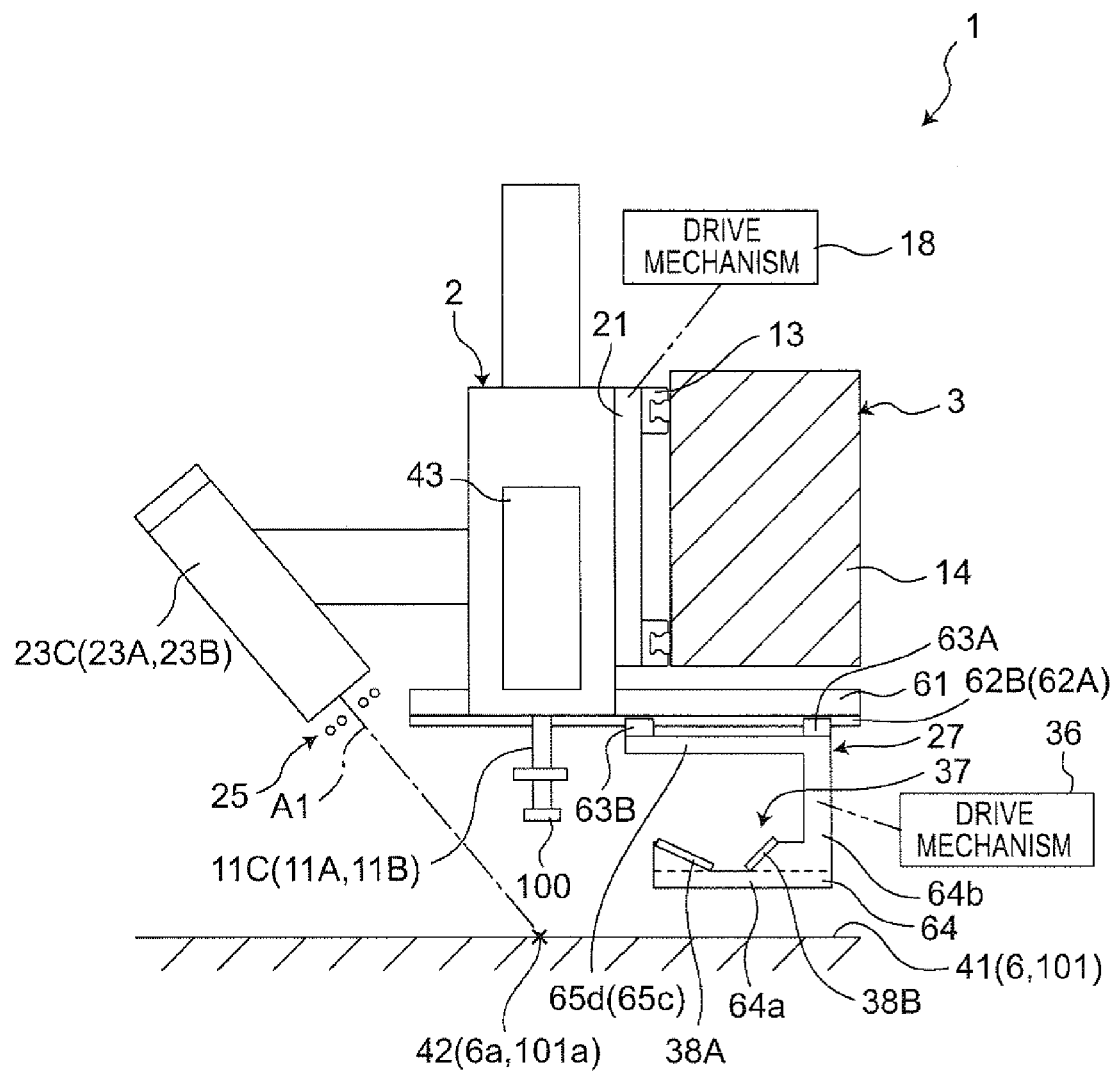
FIG. 6B is a view in which the mounting head in the third embodiment is seen from the X direction (the mirror unit is placed at a retreat position)
Figure 7:
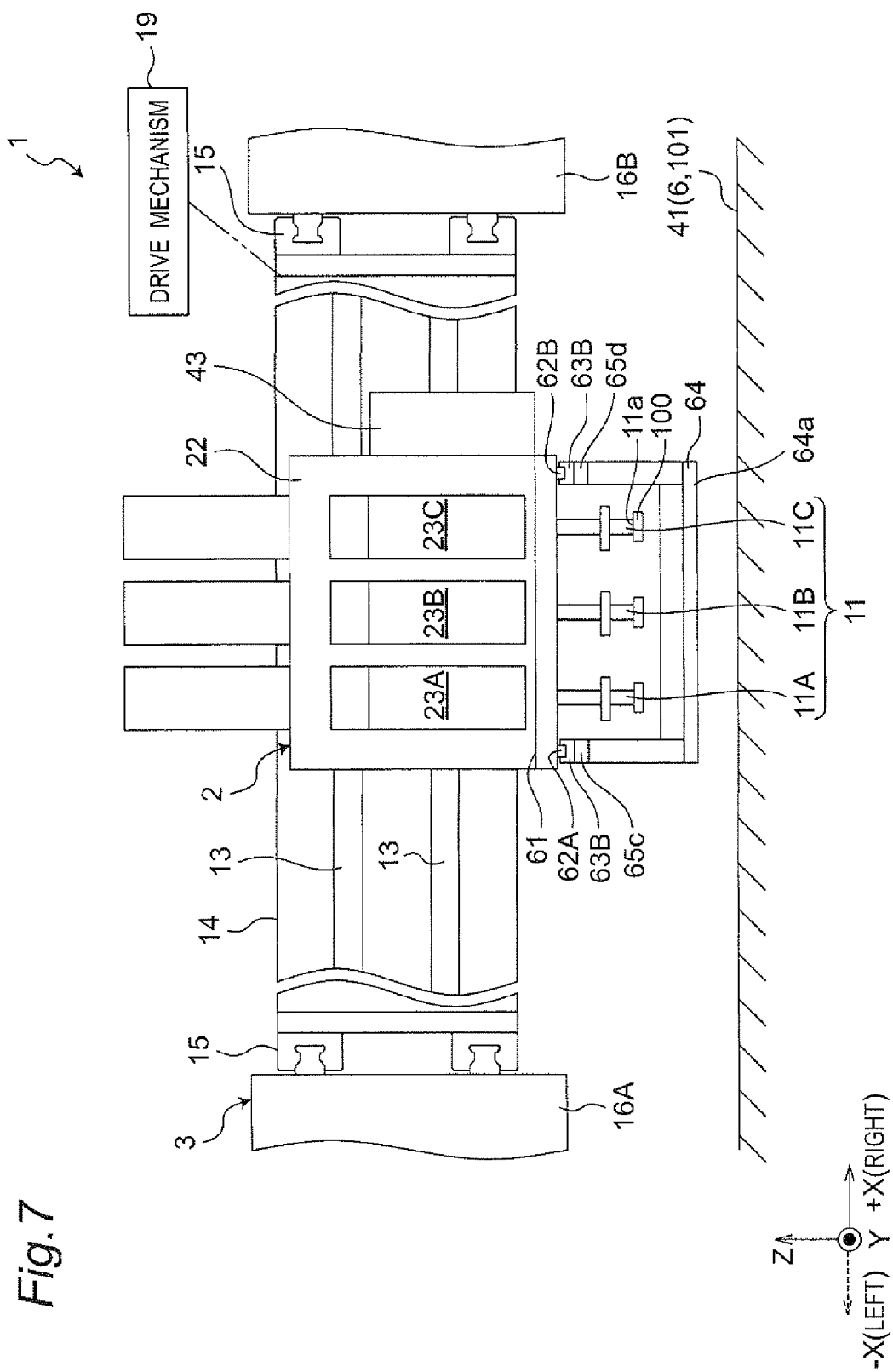
FIG. 7 is a view in which the mounting head in the third embodiment is seen from the Y direction.

FIGS. 6A to 7 show a component mounting device 1 according to a third embodiment of the present invention. In the vicinity of the lower end of a head main body 22 of a mounting head 2 in the present embodiment, a plate shape rail bracket 61 protruding in the Y direction (toward the left side in FIGS. 6A and 6B and the near side on a paper plane in FIG. 7) is provided. The rail bracket 61 extends to the lower side of an X beam 14. On a lower surface of the head main body 22 and the rail bracket 61, guide rails 62A, 62B extending in the Y direction in parallel to each other are provided. Guide blocks 63A, 63B are respectively engaged with these guide rails 62A, 62B so as to go back and forth in the Y direction. A casing 64 of a mirror unit 27 is suspended on these guide blocks 63A, 63B.

The casing 64 of the mirror unit 27 in the present embodiment is provided with a plate shape base portion 64*a* spreading on a substantial XY plane, and a support wall 64*b* protruding upward from the rear end side of this base portion 64*a* (the right end side in FIGS. 6A and 6B). A pair of arm portions 65*c*, 65*d* protruding in the Y direction from the upper end side of the support wall 64*b* is provided. The guide block 63A is fixed to the base end side of the arm portions 65*c*, 65*d*, and the guide block 63B is fixed to the tip side of the arm portions 65*c*, 65*d*.

The mirror unit 27 is moved to go back and forth in the Y direction along the guide rails 62A, 62B by a mirror drive mechanism 36. Specifically, the mirror unit 27 is movable between an advance position shown in FIG. 6A and a retreat position on the lower side of the X beam 14 as shown in FIG. 6B. That is, the mirror unit 27 in the present embodiment is moved in the direction orthogonal to the X direction serving as the line direction of the suction nozzles 11A to 11C, so as to be moved to the advance position and the retreat position.

A reflective optical system 37 accommodated in the casing 64 of the mirror unit 27 is provided with two mirrors 38A, 38B for each of the suction nozzles 11A to 11C.

As shown in FIG. 6A, when the mirror unit 27 is placed at the advance position, the mirrors relatively advance into a viewing field of image capturing cameras 23A to 23C for all suction nozzles 11A to 11C, and an optical axis for image capturing of the image capturing cameras 23A to 23C is bent as shown by one-chain line A2 and directed to tip surfaces 11*a* of the suction nozzles 11A to 11C. That is, when the mirror unit 27 is placed at the advance position, the corresponding image capturing cameras 23A to 23C can capture images of the tip surfaces 11*a* of all the suction nozzles 11A to 11C and components 100 suctioned by the suction nozzles. That is, when the mirror unit 27 is placed at the advance position, the images of the tip surfaces 11*a* of the plurality of suction nozzles 11A to 11C and the components 100 suctioned by the suction nozzles can be captured at once.

Meanwhile, as shown in FIG. 6B, when the mirror unit 27 is placed at the retreat position, the two mirrors 38A, 38B relatively retreat from the viewing field of the image capturing cameras 23A to 23C for any of the suction nozzles 11A to 11C, and the optical axis for image capturing of the image capturing cameras 23A to 23C extends directly obliquely downward as shown by one-chain line A1 and reaches an image capturing position 42 (component supplying positions 6*a*, mounting positions 101*a*) of an image capturing object (a component supplying unit 6, a substrate 101).

In the present embodiment, the mirror unit 27 is moved in the direction orthogonal to the X direction serving as the line direction of the suction nozzles 11A to 11C, so as to be moved to the advance position and the retreat position. The mirror unit 27 placed at the retreat position is placed on the lower side of the X beam 14. Therefore, as most clearly shown in FIG. 7, there is no need for providing guide rails protruding in the X direction (the width direction) from the head main body 22 of the mounting head 2 in order to ensure the retreat position, so that size in the X direction of the mounting head 2 can be reduced. By reduction in the size in the X direction of the mounting head 2, the component mounting device 1 in the carrying direction (the line longitudinal direction) of the substrate 101 can be downsized.

In the present embodiment, as shown in FIGS. 6A and 6B, the suction nozzles 11 (11A to 11C) are arranged in a row along the X direction. However, the mounting head 2 may be provided with suction nozzles arranged in two rows along the X direction.

Since other configurations and operations of the third embodiment are the same as the first embodiment, the same elements are given the same reference signs and description thereof is omitted.

The present invention is not limited to the above embodiments but various modifications are available as listed below as examples.

In the first and second embodiments, the mirror unit 27 is moved with respect to the suction nozzles 11A to 11C and the image capturing cameras 23A to 23C. In the second embodiment, the mirror unit 27 and the image capturing camera 23 are moved with respect to the suction nozzles 11A to 11C. However, the suction nozzle 11 (11A to 11C) may be moved together with the image capturing camera 23 (23A to 23C) with respect to the mirror unit 27. In this case, when the suction nozzle 11 (11A to 11C) is arranged together with the image capturing camera 23 (23A to 23C) with respect to the mirror unit 27, the reflection surfaces of the mirrors 38A, 38B of the mirror unit 27 relatively advance into the viewing field of the image capturing camera 23, and the image capturing camera 23 captures the images of the tip surface 11*a* of the suction nozzle 11 and the component 100 suctioned by the suction nozzle. When no suction nozzle 11 is arranged with respect to the mirror unit 27, the reflection surfaces of the mirrors 38A, 38B of the mirror unit 27 relatively retreat from the viewing field of any image capturing camera 23, and the image capturing camera 23 captures the images of the mounting positions 101*a* and the component supplying positions 6*a* (or the components 100 at these positions).

A configuration of the reflective optical system provided in the mirror unit is not limited to the embodiments but three or more mirrors may be provided or conversely, two or more reflection surfaces may be formed in regions of different angles in one mirror. The reflection surfaces of the mirror are not limited to flat mirrors but concaved or convexed mirrors. The mirror unit in the above embodiments is moved to the advance positions and the retreat position by linear movement in any case. However, the mirror unit may be moved to the advance positions and the retreat position by turning or rotation on a horizontal surface or a surface inclined with respect to the horizontal surface. Further, the mirror unit may be moved on a moving route formed by combination of moving curved lines of routes combining two or more straight lines and/or curved lines, so as to be moved between the advance positions and the retreat position.

The invention claimed is:

1. A component mounting device, comprising:
   a mounting head provided with a suction nozzle for suctioning and holding a component at a tip thereof, the mounting head holding the component arranged at a component supplying position by the suction nozzle and mounting the component onto a mounting position on a substrate by up-and-down motion;
   an image capturing device provided in the mounting head, the image capturing device having an optical axis for image capturing which extends straightly and obliquely downward so as to directly capture an image of a captured position below the suction nozzle; and a mirror unit provided with a plurality of reflection surfaces, the mirror unit being configured to be moved to an advance position where the plurality of reflection surfaces relatively advance into a viewing field of the image capturing device provided in the mounting head and refract on the optical axis for image capturing of the image capturing device and thereby the image capturing device is capable of taking an image of at least any one of the tip of the suction nozzle and the component held by the suction nozzle, and to a retreat position where the plurality of reflection surfaces retreat from the viewing field of the image capturing device and thereby the optical axis for image capturing extends obliquely downward without going through the reflection surfaces so that the image capturing device is capable of directly capturing an image of at least any one of the component supplying position and the mounting position, the mirror unit being provided in the mounting head.

2. The component mounting device according to claim 1, wherein the plurality of suction nozzles are arranged in line along one direction in the mounting head, and wherein the mirror unit is moved along the line direction of the suction nozzles so as to be moved to the advance position and the retreat position.

3. The component mounting device according to claim 2, wherein the reflection surfaces have a size and a shape to be placed at the advance position for one of the plurality of suction nozzles, and wherein the mirror unit is moved along the line direction of the suction nozzles so as to be placed at the advance position successively for each of the plurality of suction nozzles.

4. The component mounting device according to claim 1, wherein the plurality of suction nozzles are arranged in line along one direction in the mounting head, and wherein the mirror unit is moved in a direction crossing the line direction of the suction nozzles so as to be moved to the advance position and the retreat position.

5. The component mounting device according to claim 4, wherein the mounting head is supported by an X beam movably in an X direction, the line direction of the suction nozzles being oriented in the X direction, wherein the reflection surfaces have a size and a shape to be placed at the advance positions for all the plurality of suction nozzles at the same time, and wherein the mirror unit is placed on a lower side of the X beam at the retreat position.

6. A component mounting method for suctioning and holding a component arranged at a component supplying position by a tip of a suction nozzle provided in a mounting head and mounting the component onto a mounting position on a substrate by up-and down motion, comprising:

providing the mounting head with an image capturing device and a mirror unit, the image capturing device having an optical axis for image capturing which extends straightly and obliquely downward so as to directly capture an image of a captured position below the suction nozzle, the mirror unit being provided with a plurality of reflection surfaces and movable to an advance position where the plurality of reflection surfaces relatively advance into a viewing field of the image capturing device and refract an optical axis for image capturing of the image capturing device and refract, and to a retreat position where the plurality of reflection surfaces retreat from the viewing field of the image capturing device;

moving the mirror unit to the advance position so that the image capturing device captures an image of at least one of the component held by the suction nozzle when the mounting head goes toward the mounting position after holding the component at the component supplying position and the tip of the suction nozzle when the mounting head returns to the component supplying position after mounting the component onto the mounting position; and moving the mirror unit to the retreat position so that the optical axis of the image capturing extends straightly and obliquely downward without going through the reflection mirrors, and so that the image capturing device directly captures an image of at least any one of the component at the component supplying position, the mounting position of the substrate before mounting the component, and the mounting position of the substrate after mounting the component positioned at the image captured position by the image capturing device.

* * * * *